(12) United States Patent
Cruz

(10) Patent No.: US 8,575,747 B2
(45) Date of Patent: Nov. 5, 2013

(54) CLIP INTERCONNECT WITH ENCAPSULATION MATERIAL LOCKING FEATURE

(75) Inventor: Randolph Cruz, Melbourne, FL (US)

(73) Assignee: Intersil Americas Inc, Milpitas, CA (US)

( * ) Notice: Subject to any disclaimer, the term of this patent is extended or adjusted under 35 U.S.C. 154(b) by 88 days.

(21) Appl. No.: 13/189,074

(22) Filed: Jul. 22, 2011

(65) Prior Publication Data
US 2012/0133037 A1 May 31, 2012

Related U.S. Application Data

(60) Provisional application No. 61/418,226, filed on Nov. 30, 2010.

(51) Int. Cl.
H01L 23/12 (2006.01)

(52) U.S. Cl.
USPC .......................................... 257/704

(58) Field of Classification Search
USPC .......................................... 257/704
See application file for complete search history.

(56) References Cited

U.S. PATENT DOCUMENTS 7,012,326 B1 * 3/2006 Wu et al. .......... 257/678
2009/0121331 A1 * 5/2009 Cruz ............... 257/676

* cited by examiner

Primary Examiner — Jenny L Wagner
(74) Attorney, Agent, or Firm — Fogg & Powers LLC

(57) ABSTRACT

A clip interconnect comprises a columnar part, a bridge part, and a locking feature. The bridge part has a plurality of sides. The columnar part and the bridge part are configured to form an angle at an interface between the columnar part and the bridge part. The locking feature is located in at least one of the plurality of sides of the bridge part. The locking feature comprises an alternating pattern of teeth and valleys.

31 Claims, 9 Drawing Sheets

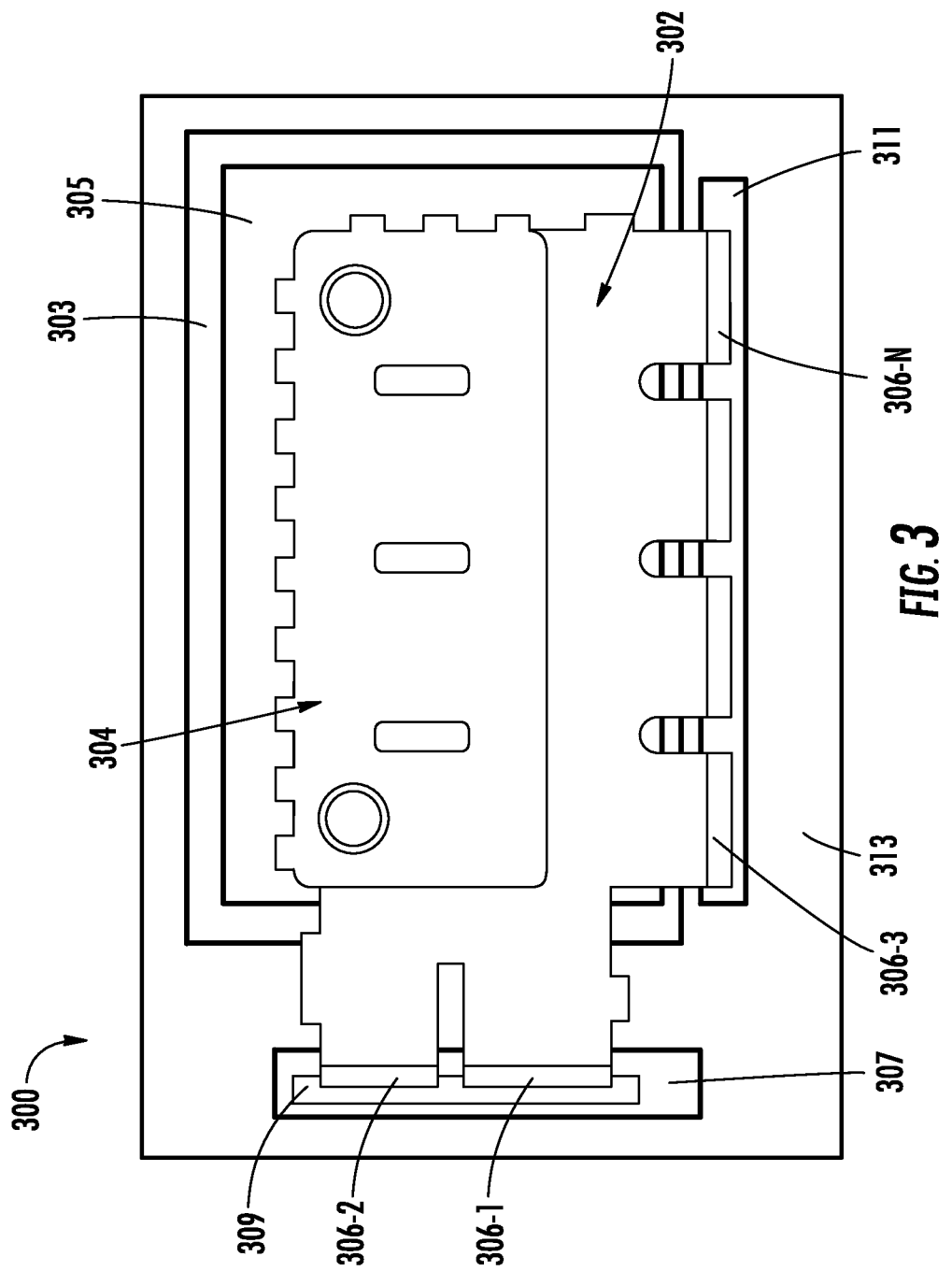

CLIP INTERCONNECT WITH ENCAPSULATION MATERIAL LOCKING FEATURE

CROSS REFERENCE TO RELATED APPLICATIONS

This application is related to U.S. provisional patent application Ser. No. 61/418,226 entitled "CLIP INTERCONNECT WITH ENCAPSULATION MATERIAL LOCKING FEATURE," filed on Nov. 30, 2010 and referred to herein as the '226 application. The '226 application is hereby incorporated herein by reference. The present application hereby claims priority to U.S. Provisional Patent Application No. 61/418,226.

DRAWINGS

Understanding that the drawings depict only exemplary embodiments and are not therefore to be considered limiting in scope, the exemplary embodiments will be described with additional specificity and detail through the use of the accompanying drawings, in which:

FIG. 3 is a block diagram of one embodiment of a semiconductor die structure.

In accordance with common practice, the various described features are not drawn to scale but are drawn to emphasize specific features relevant to the exemplary embodiments.

DETAILED DESCRIPTION

In the following description, reference is made to the accompanying drawings that form a part hereof, and in which is shown by way of illustration specific illustrative embodiments. However, it is to be understood that other embodiments may be utilized and that logical, mechanical, and electrical changes may be made. The following description is, therefore, not to be taken in a limiting sense.

The embodiments described below mitigate delamination between a clip mount (also referred to herein as a clip interconnect) and a die to which the clip mount is coupled by a mold compound such as a solder paste. Delamination is the separation of the mold compound from the clip mount. In addition, the embodiments described below inhibit the free propagation of delamination in the event that localized delamination occurs.

Figure 1A:
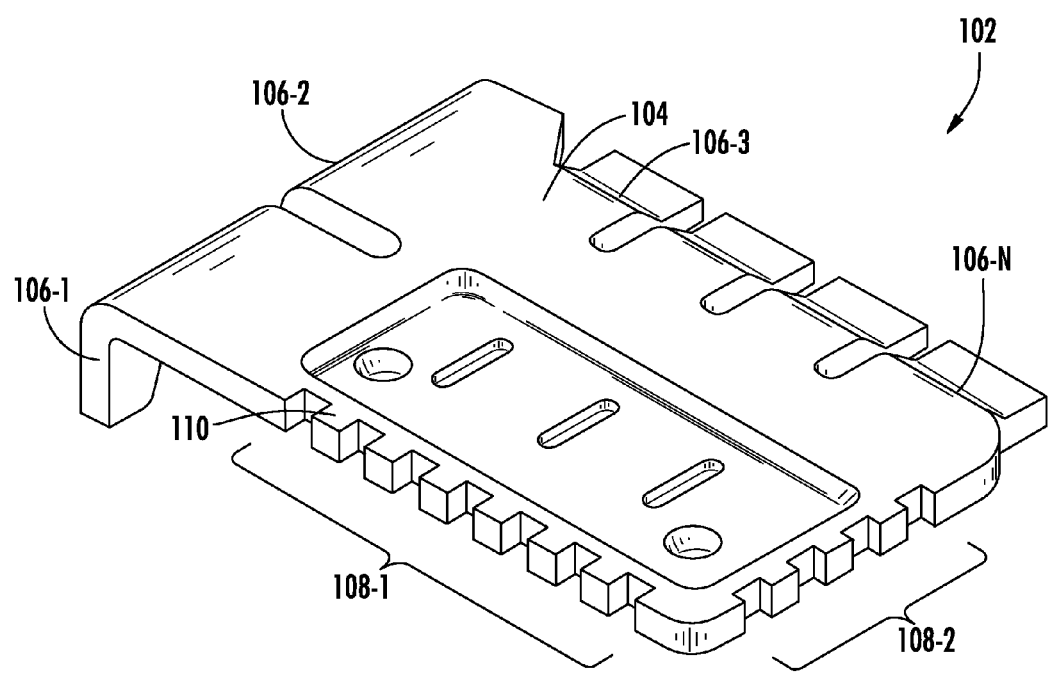
FIG. 1A is a perspective view of one embodiment of an exemplary clip mount.
Figure 4A:
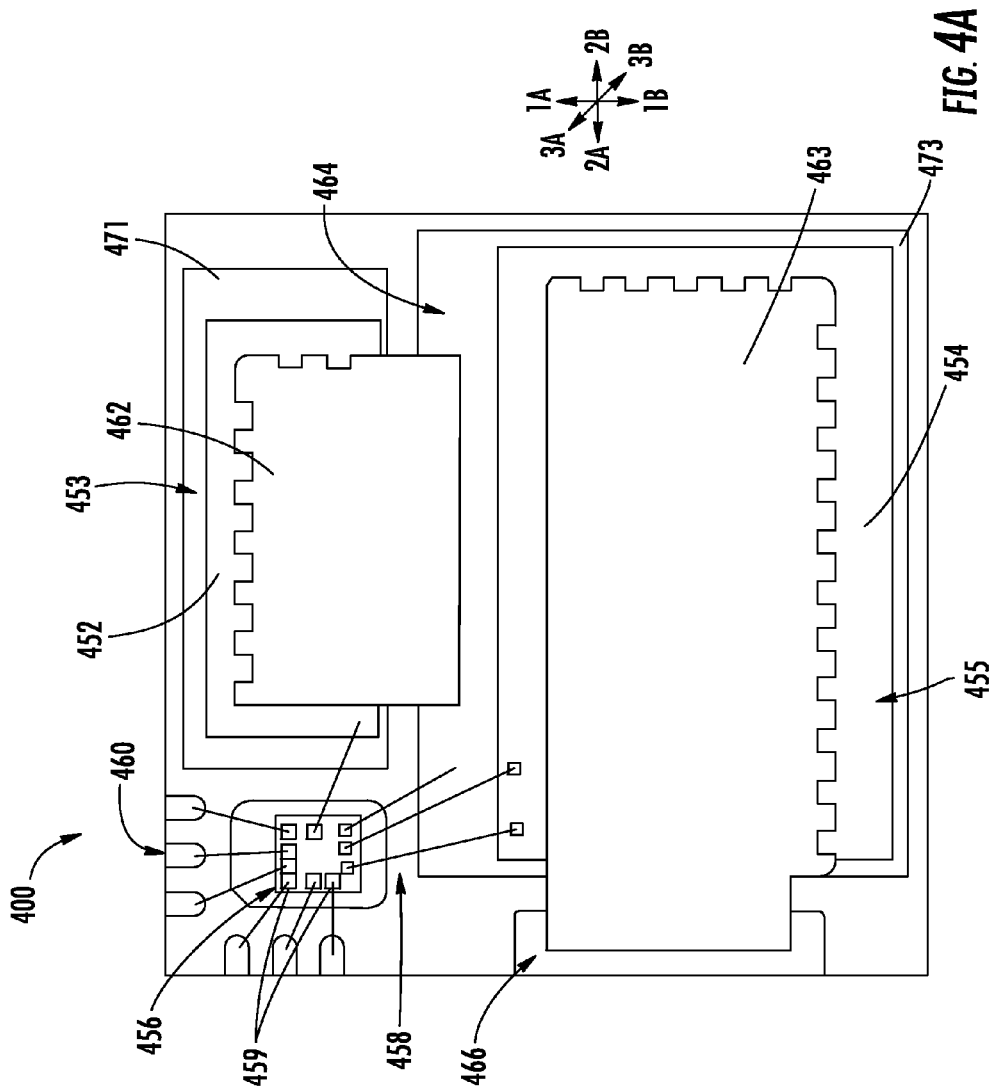
FIG. 4A is a top view of another embodiment of an exemplary semiconductor die structure.

Terms of relative position as used in this application are defined based on a plane parallel to the conventional plane or working surface of a wafer or substrate, regardless of the orientation of the wafer or substrate. For example, the term "horizontal" or "lateral" as used in this application is defined as a plane parallel to the conventional plane or working surface of a wafer or substrate, regardless of the orientation of the wafer or substrate. The term "vertical" refers to a direction perpendicular to the horizontal. Terms such as "on," "side" (as in "sidewall"), "higher," "lower," "over," "top," "above", "below," and "under" are defined with respect to the conventional plane or working surface being on the top surface of the wafer or substrate, regardless of the orientation of the wafer or substrate FIG. 1A is a perspective view of one embodiment of an exemplary clip mount 102 (also referred to herein as a clip interconnect or clip). The clip mount 102 is fabricated from a conductive material such as copper or a copper alloy. In addition, in some embodiments, the clip mount 102 is plated with another conductive material, such as a metallic material. The conductive material used to plate the clip mount 102 can have a higher or lower resistivity than the conductive material of the clip mount 102. In the embodiment shown in FIG. 1, the clip mount 102 includes a plurality of columnar parts 106-1 . . . 106-N and a bridge 104. The columnar parts 106-1/106-2 and the bridge 104 form an approximately 90 degree angle where the columnar parts 106-1/106-2 meet the bridge 104, respectively. However, it is to be understood that other angles can be formed between the columnar parts 106 and the bridge 104. For example, columnar parts 106-3 . . . 106-N form an approximate 45 degree angle with the bridge 104, as shown in FIG. 1. In addition, although the embodiment shown in FIG. 1 includes a plurality of columnar parts 106, it is to be understood that, in other embodiments, only a single columnar part is used, as shown in FIG. 4A.

The bridge 104 also includes a locking feature 108-1 in a first side of the bridge 104 and a locking feature 108-2 located in a second side of the bridge 104. Although, the locking features 108-1 and 108-2 are depicted in only two sides of the bridge 104, it is to be understood that a locking feature can be located in any side of the bridge 104 and/or any side of one or more of the columnar parts 106.

The locking features 108-1 and 108-2 are comprised of a plurality of teeth or protrusions 110. As described in more detail below, the locking features 108 increase the contact surface area at the targeted interface and inhibit the propagation of localized delamination. The locking features 108 are formed into the clip mount 102. For example, the locking features 108 can be etched into a sheet of metal. In other embodiments, the locking features 108 are stamped into a sheet of metal. The metal is then configured and bent to form the columnar part 106 and the bridge part 104 of the clip mount 102. Since this is a manufacturing change, after the initial cost of retooling the manufacturing design process, no per unit costs are incurred, unlike chemical pretreatments used to increase the roughness of the clip. However, chemical pretreatments or other conventional techniques to address potential reliability issues can still be used in conjunction with the interlocking features described herein.

Figure 1B:
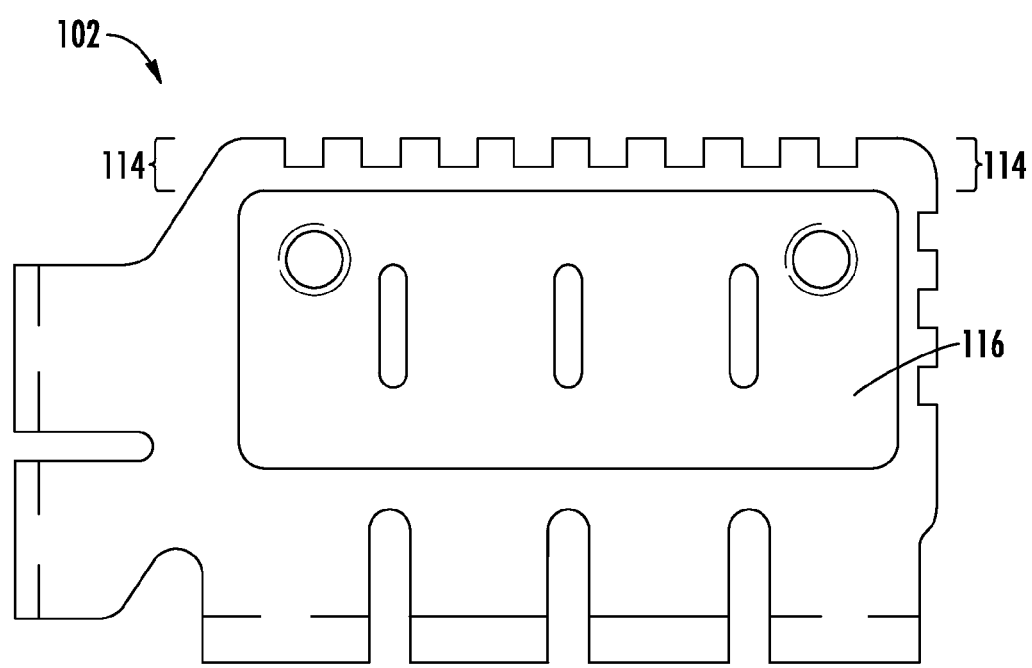
FIG. 1B is a top view of the exemplary clip mount shown in FIG. 1A.

FIG. 1B is a top view of the exemplary clip mount 102 shown in FIG. 1A. As shown in FIG. 1B, the clip mount 102, in this embodiment, includes a flange 114. The flange 114 completes a ring of a raised up layer around a recessed portion 116. In some such embodiments, a second die is placed on top of the clip mount 102 after coupling the clip mount to a die underneath the clip mount 102. However, it is to be understood that, in some embodiments, the flange 114 is not included. For example, the clip mount 302 shown in FIG. 3 below does not include the flange 114.

Figure 2:
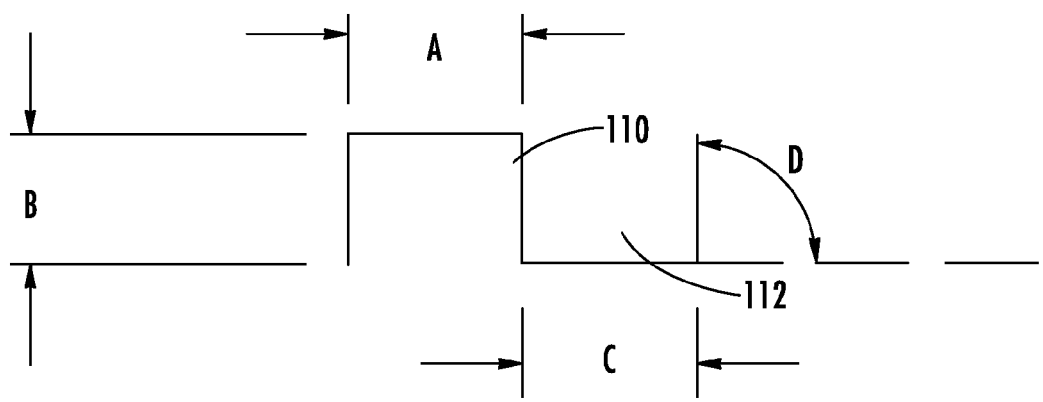
FIG. 2 is a partial view of one embodiment of an exemplary locking f which can be implemented in one or more sides of an exemplary clip mount.

FIG. 2 is a partial view of an exemplary locking feature 208 which can be implemented in one or more sides of a clip mount 102. As shown in FIG. 2, each tooth or protrusion 110 of the locking feature 208 has a length A and a height B. The distance C is the length of the edge between two teeth 110. This edge between two teeth is also referred to herein as a valley 112. The angle D is the angle formed where the surface between two teeth joins the side of the teeth. Values for each of A, B, C, and D can vary based on design considerations such as manufacturing capability or design tradeoffs. In addition, although the locking feature 208 shown in FIG. 2 includes uniform teeth and valley sizes/shapes, it is to be understood that in other embodiments, the teeth and valleys are not uniform. For example, the values of A, B, C, and D can vary from tooth to tooth and/or from valley to valley. In addition, although the teeth 110 shown in FIG. 2 have a rectangular shape, it is to be understood that other shapes can be used in other embodiments. For example, by varying the angle D, other polygonal shapes can be used.

Table 1 below provides exemplary values for the variable A while holding values for B, C, and D constant. Table 1 also indicates the resulting approximate increase in interface linear contact. Although Table 1 provides measurements for a linear contact, for purposes of explanation, it is to be understood that the contact surface area can be obtained by multiplying the linear measurement provided in Table 1 by the width of the tooth.

TABLE 1

| EMC Locking Feature Size | | | | % Increase Interface |
|---|---|---|---|---|
| A | B | C | D | Linear Contact |
| 0.10 mm | 0.20 mm | 0.20 mm | 90 Degrees | 42.2% |
| 0.15 mm | 0.20 mm | 0.20 mm | 90 Degrees | 63.4% |
| 0.20 mm | 0.20 mm | 0.20 mm | 90 Degrees | 84.7% |

The interlocking features not only increase the contact area but also inhibit the free propagation of delamination. In particular, each edge or side having an interlocking feature is comprised of a plurality of mini-planes. Each mini-plane is defined by one of the edges of a tooth or the edge of a valley between teeth. Since the direction of the clip side changes at each interface between the teeth and the valleys, for example, local delamination is substantially stopped from propagating at the interface between the teeth and valley. Thus, should local delamination occur, the delamination is contained to a local area which improves the reliability of the integrated circuit.

Furthermore, the non-linear locking feature of the clip described above also helps distribute mechanical stress along the interface. By distributing the stress, package body cracks (cracks in the encapsulation) along the otherwise long linear edge of the interface (that is, the edge is a long linear edge if the locking feature is not included) propagating outwards to the top surface of the package/encapsulation are reduced or eliminated. This is especially important for situations when the amount of encapsulation above the clip is minimal such as the case with thin profile packages (e.g. packages in which there is minimal encapsulation material between the clip edges and package body external edges.) Furthermore, cracks on the underside of a substrate (the side opposite the clip mount) are also reduced. In particular, the non-linear locking feature prevents delamination of the clip which inhibits movement or shifting of the clip out of place. Thus, stresses on the underside of the substrate due to shifting of the clip are consequently reduced.

FIG. 3 is a block diagram of one embodiment of a semiconductor die structure 300 having a clip mount 302. The die structure can be implemented in discrete devices or in an integrated circuit. The die structure includes a die pad or "paddle" 303 upon which a die 305 is attached, usually by some type of die-attach adhesive (such as a solder paste). The die 305 can be implemented as any appropriate circuit, such as, but not limited to, a power metal-oxide-semiconductor field-effect transistor (MOSFET) or an insulated gate bipolar transistor (IGBT). The die structure 300 also includes a contact 307 and a contact 311, each near the paddle 303. The die pad 303 and the contacts 307/311 are coupled to a substrate 313. The contact 307 is processed, in this embodiment, to include a recess-like "tub" 309 having an approximate or general parallelepiped or prismatic form in this example.

In the embodiment shown in FIG. 3, the tub 309 is shown in a geometrically idealized form with straight lines that intersect at edges to define flat parallel planes and to define corners and vertices without substantial radii. However, it is to be understood that the tub 309 can also be characterized as a pocket, groove, recess, or trench which differs from the idealized form shown depending upon the manufacturing process and design constraints. In this exemplary embodiment, tub 309 is formed with a depth that is about one-half the total thickness of the contact 307. One exemplary thickness of the contact 107 is approximately eight mil (0.008 inch) with tub depth of about four mil (0.004 inch). In those cases where the contact 307 is fabricated by etching techniques, the tub 309 can be implemented by a conventional half-etch. Additional details regarding exemplary configurations of tub 309 can be found in co-pending U.S. patent application Ser. No. 12/252,332 and co-pending U.S. patent application Ser. No. 12/250,525 which are incorporated herein by reference.

As shown in FIG. 3, the clip 302 is electrically and physically mated to the die 305. In addition, the columnar parts 306 are electrically and physically coupled to the contacts 307 and 311. In particular, the columnar parts 306-1 and 306-2 are inserted into the tub 309 using, if desired, an adhesive or adherent solder-paste to secure the parts together. In addition, the parts can be so dimensioned that the columnar parts 306-1 and 306-2 can be inserted into the tub 309 with a line-to-line fit. The bridge 304 overlies the top surface of the die 305 and is attached thereto by conventional connection techniques including the use of a solder paste or an adhesive solder paste. As shown in FIG. 3, the bridge 304 includes two sides that each has a plurality of protrusions 310. The protrusions extend in a direction parallel to the top surface of the die 305.

Thus, the die structure 300 includes a clip 302 which is placed on top of the die 305 and a die 305 which is placed on top of the paddle 303. Sometime after placement of the clip 302, the assemblage can be subject to a solder reflow step to electrically connect and mechanically secure the parts together. The use of the tub 309 increases the probability that the clip 302 will remain in place during subsequent processing until such time that the solder reflow step is completed.

Figure 4B:
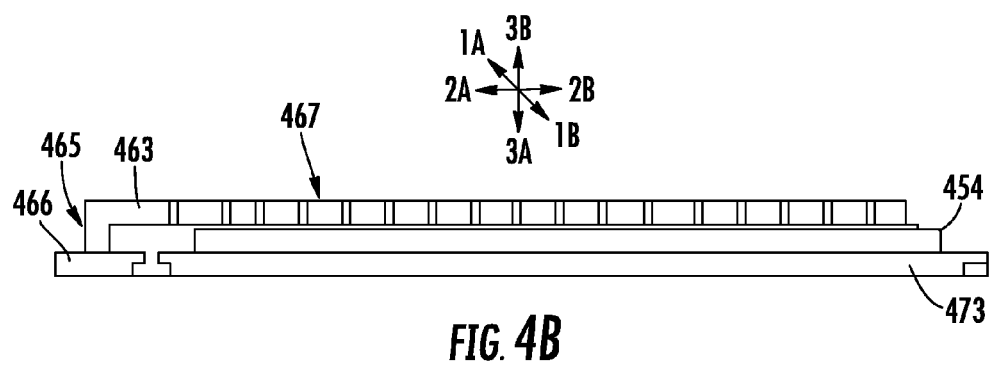
FIGS. 4B-4C are side views of the exemplary semiconductor die package shown in FIG. 4A.
Figure 4C:
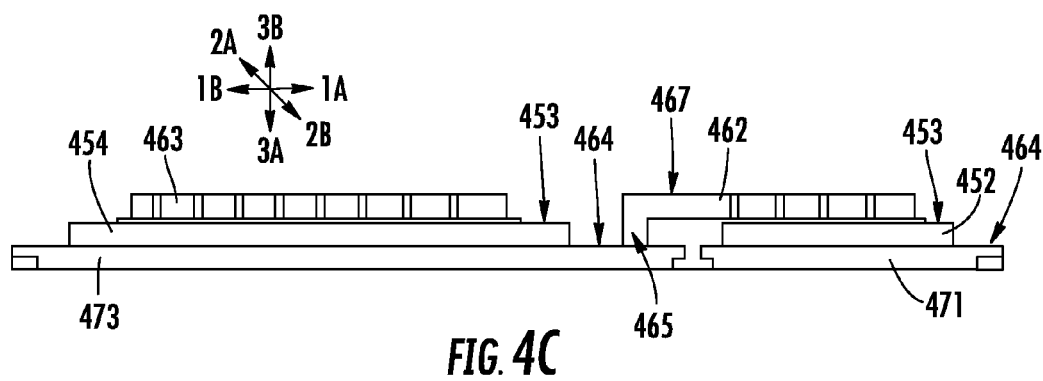

FIGS. 4A-4C illustrate another embodiment of a semiconductor die structure or package 400. In particular, FIG. 4A depicts a top view of the semiconductor die package 400, where the direction 3A goes into the page and the direction 3B comes out of the page. FIGS. 4B and 4C are side views of the semiconductor die package 400. In FIG. 4B, the direction 1A goes into the page and the direction 1B comes out of the page. In FIG. 4C, the direction 2A goes into the page and the direction 2B comes out of the page.

FIG. 4A shows first and second field effect transistors (FETs) 452 and 454 mounted atop respective leadframes 471 and 473 (also referred to herein as die pads). In particular, a bottom surface 465 of the respective FET 452/454 is attached to a top surface 464 of the respective leadframe 471/473. A controller or driver chip 456 is connected via bonding wires 458 between conductive pads 459 on the driver chip 456 to contacts 460 and via bonding wires 458 connected to selected portions of the FETs 452 and 454. Although each FET 452/454 is mounted on a respective leadframe 471/473 in FIG. 4A, both respective leadframes 471 and 473 together comprise a leadframe for the assembly.

As shown in this exemplary embodiment, a first conductive clip 462 is connected between the top surface 453 of the FET 452 and a portion of a top surface 464 of the leadframe 473. A second conductive clip 463 is connected between the top surface 455 of the FET 454 and a contact 466. In this example, the contact 466 does not include a tub, as shown in FIG. 3, above. However, it is to be understood that the contact 466 includes a tub, in other embodiments. Additionally, in some embodiments, a tub is included in the top surface 464 of leadframe 473 where the first conductive clip 462 is connected.

The clips 462 and 463 are designed to conduct current from the FETs 452 and 454 to the contact 466. In the embodiment shown in FIG. 4A, the FETs 452 and 454 can be implemented as power-switching or power-handling FETs. Thus, the controller or driver chip 456 can direct the switching on and off of the FETs 452 and 454.

As shown in FIG. 4A, each of the clips 462 and 463 includes locking features 108, each locking feature comprising a plurality of teeth. As described above, the locking features 108 inhibit the propagation of localized delamination. In other embodiments, only one of the clips 462 and 463 includes the locking features. Alternatively, in other embodiments, one or both of the locking features 462 and 463 includes a locking feature 108 on only one side of the bridge section.

As shown in FIGS. 4B and 4C, the clips 462 and 463 are fabricated as generally or approximately "L" shaped members, in this embodiment, with an upstanding columnar portion or section 465 and a cantilevered portion or section 467 (also referred to herein as a bridge portion) that extends to the contact surface of the respective FET. The clips are typically fabricated from copper or a copper alloy. However, it is to be understood that other materials can be used for fabrication of the clips, in other embodiments.

Figure 5:
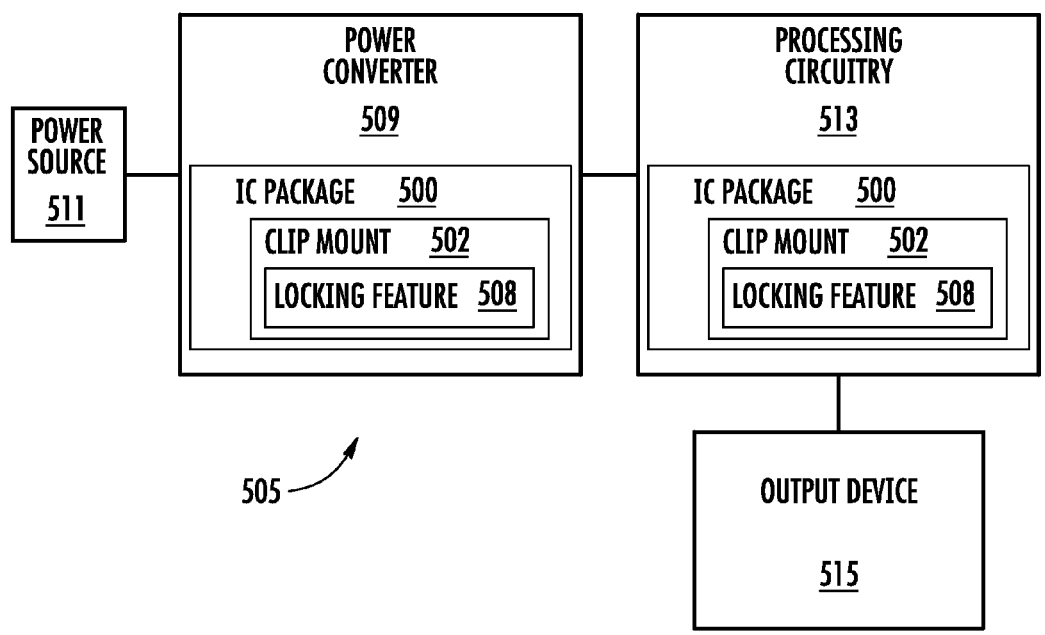
FIG. 5 is a high level block diagram depicting an exemplary system comprising at least one semiconductor die package.

A clip having locking features can be used in any integrated circuit or device to inhibit localized delamination. For example, FIG. 5 is a high level block diagram depicting an exemplary system 505 comprising at least one semiconductor die package 500 having a clip 502 having locking features 508. The system 505 comprises a power converter 509 coupled to a power source 511 and processing circuitry 513.

In the exemplary embodiment shown in FIG. 5, the power converter 509 incorporates at least one semiconductor die package 500, such as semiconductor die package 400 described above. The power converter 509 is coupled to the power source 511 and is configured to convert the power received from the power source to a level and polarity usable by the processing circuitry 513. In particular, the power converter 509 includes two power-switching FETs, as described above with respect to FIG. 4. In this embodiment, a clip is coupled to the top of each FET for conducting current as described above. In addition, each clip includes a locking feature on at least one side to inhibit localized delamination, as described above.

The power converter 509 can be implemented, for example, as a direct current (DC) to direct current converter to lower or raise the voltage level of the power received from the power source 511 to a level required by the processing circuitry 513. Alternatively, the power converter 509 can be implemented as an alternating current (AC) to direct current (DC) converter. Additionally, in some embodiments, the power converter 509 is a high-current and high-voltage power converter. However, embodiments of devices described herein can be implemented in other power devices, high-power density and high-efficiency DC power converters, and high voltage AC/DC power converters.

In one embodiment, the power source 511 is external to the device 505. For example, the power source 511 can be mains power coupled to the device 505 via an electrical socket. In other embodiments, the power source 511 can be internal to the device 505, such as a battery.

In addition, in this embodiment, the processing circuitry 513 also includes at least one semiconductor die package 500 having a clip mount 502 with a locking feature 508 as described above. The locking feature 508 inhibits localized delamination which improves the stability and performance of the semiconductor die package in the processing circuitry 513. The processing circuitry 513 processes signals and data and provides an output to an output device 515. Additionally, the power converter in this example also includes an semiconductor die package 500 having a clip mount 502 with a locking feature 508 as described above.

The device 505 can be implemented as any electronic device, such as a cell phone, computer, navigation device, microprocessor, a high frequency device, etc. Hence, the implementation of the processing circuitry is dependent on the particular device. For example, when device 505 is implemented as a cell phone, the processing circuitry 513 can include a digital signal processor (DSP), analog-to-digital (ADC) converters, radio frequency transmission and reception amplifiers, memory circuits, and a microprocessor, as known to one of skill in the art. Similarly, when the device is implemented as a cell phone, the output device 515 can be implemented as a speaker, display unit, transmission antenna, etc., as known to one of skill in the art.

Figure 6:
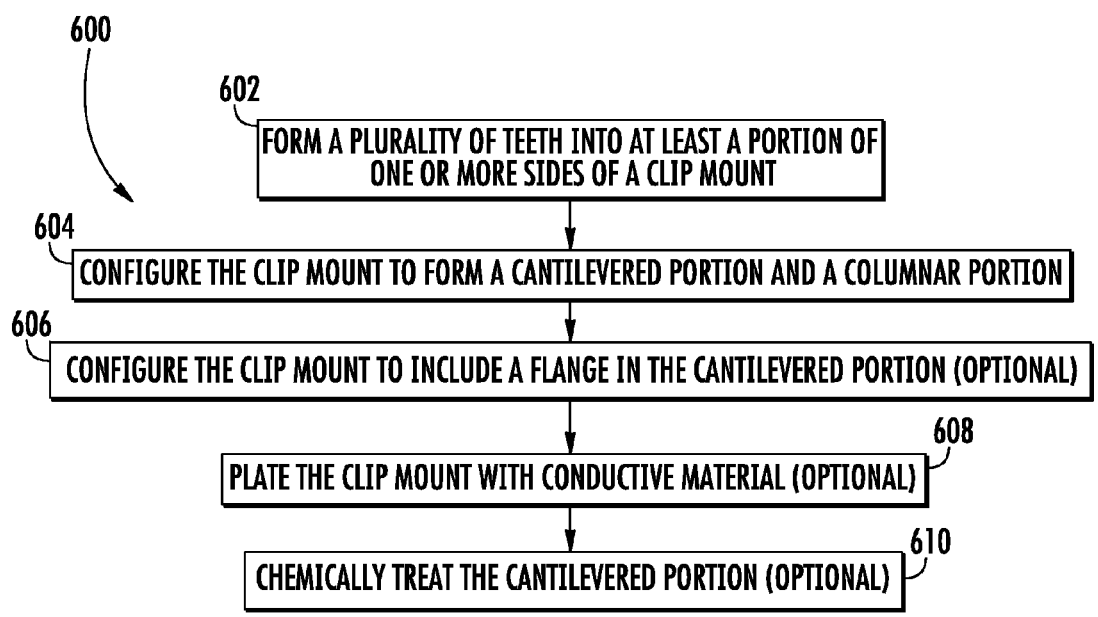
FIG. 6 is a flow chart depicting an exemplary method of manufacturing a clip mount.

FIG. 6 is a flow chart depicting an exemplary method 600 of manufacturing a clip mount. Method 600 can be used to manufacture a clip mount such as clip mount 100 described above. At block 602, a plurality of teeth are formed (e.g. etched or stamped) into at least a portion of one or more sides of a sheet of electrically conductive material, such as a metallic material. For example, in some embodiments, the teeth are etched into two sides of the metallic material. In some embodiments, the metallic material is comprised of copper or a copper alloy. At block 604, the sheet of metallic material is configured to form a cantilevered portion and a columnar portion of the clip mount. In particular, the clip mount is configured such that the teeth are located in at least one side of the cantilevered portion. In addition, in some embodiments, the sheet of metallic material is optionally configured to include a flange in the cantilevered portion at block 606.

At block 608, the clip mount is optionally plated with a conductive material, such as silver. At block 610, the cantilevered portion is optionally treated with chemicals to increase the roughness of the cantilevered portion using techniques and chemicals known to one of skill in the art.

Figure 7:
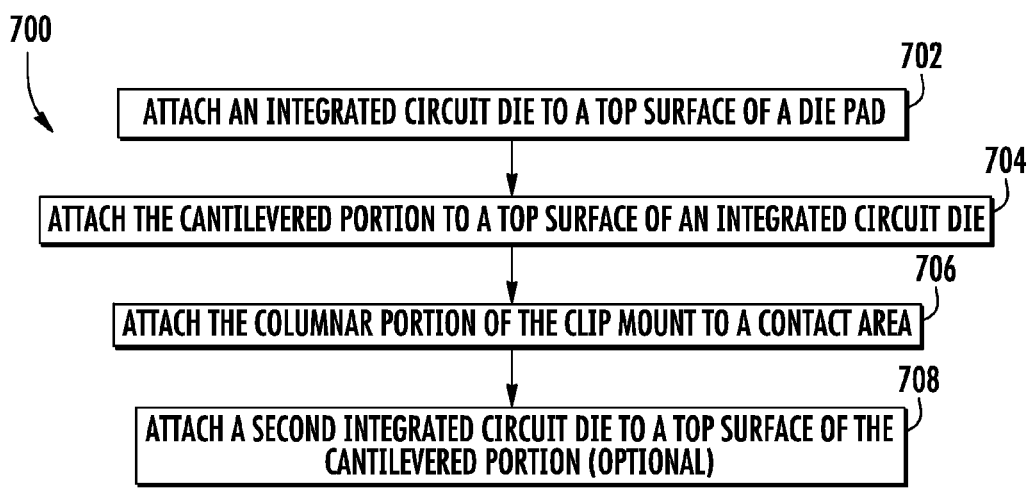
FIG. 7 is a flow chart depicting an exemplary method of manufacturing a semiconductor die package.

FIG. 7 is a flow chart depicting an exemplary method 700 of manufacturing an semiconductor die package such as package 300 or 400 described above. At block 702, an semiconductor die is coupled to a top surface of a die pad. At block 704, a cantilevered portion of a clip mount having a plurality of teeth in at least one side of the cantilevered portion is attached to a top surface of the semiconductor die. For example, the clip mount can be attached using solder paste. At block 706, a columnar portion of the clip mount is attached to a contact area that is electrically separated from the semiconductor die. In some embodiments, the contact area includes a tub portion. In such embodiments, the columnar portion is inserted into the tub portion in order to attach the columnar portion to the contact area. Additionally, in some embodiments, the clip mount includes a flange in the cantilevered portion. In some such embodiments, a second semiconductor die is optionally attached to a top surface of the cantilevered portion at block 708.

As used herein, the term 'configured' is used to mean either designed for operation in a particular manner or arranged to form a particular shape. For example, when stating that the columnar part and the bridge part are configured to form an angle at an interface between the columnar part and the bridge part, the term 'configured' means that the columnar part and bridge part are arranged such that a particular shape having an angle at an interface between the columnar part and the bridge part is formed. Additionally, when stating that a power converter is configured to convert power from a power source to a power level, the term 'configured' is used to mean that the power converter is designed to perform the particular operation of converting power from a power source to a specific power level.

Although specific embodiments have been illustrated and described herein, it will be appreciated by those of ordinary skill in the art that any arrangement, which is calculated to achieve the same purpose, may be substituted for the specific embodiments shown. For example, although the locking feature has been shown and described with two edges of the clip, it is to be understood that the locking feature can be implemented an any and all clip edges to gain similar benefits. Therefore, it is manifestly intended that this invention be limited only by the claims and the equivalents thereof.

What is claimed is:

1. A clip interconnect comprising:
   a columnar part;
   a bridge part, the bridge part having a plurality of sides, wherein the columnar part and the bridge part are configured to form an angle at an interface between the columnar part and the bridge part; and
   a locking feature located in at least one of the plurality of sides of the bridge part, the locking feature comprising an alternating pattern of teeth and valleys.

2. The clip interconnect of claim 1, wherein the clip interconnect is comprised of one of copper and a copper alloy.

3. The clip interconnect of claim 2, wherein the clip interconnect is plated with a second metallic material.

4. The clip interconnect of claim 1, wherein the bridge part includes a flange.

5. The clip interconnect of claim 1, wherein the columnar part and the bridge part are configured to form approximately a 90 degree angle at the interface between the columnar part and the bridge part.

6. The clip interconnect of claim 1, wherein the locking feature is located in two sides of the bridge part.

7. The clip interconnect of claim 1, wherein the teeth and valleys form approximate right angles at junctions between the teeth and valleys.

8. A semiconductor die package comprising:
   a die pad having a top surface;
   a semiconductor die having a top surface and a bottom surface, the bottom surface of the semiconductor die attached to the top surface of the die pad; and
   a clip mount attached to the top surface of the semiconductor die, wherein the clip mount comprises:
   a columnar part;
   a bridge part, the bridge part having a plurality of sides, wherein the columnar part and the bridge part are configured to form an angle at an interface between the columnar part and the bridge part; and
   a locking feature located in at least one of the plurality of sides of the bridge part, the locking feature comprising an alternating pattern of teeth and valleys.

9. The semiconductor die package of claim 8, wherein the clip mount is comprised of one of copper and a copper alloy.

10. The semiconductor die package of claim 9, wherein the clip mount is plated with a second metallic material.

11. The semiconductor die package of claim 8, wherein each of two sides of the clip mount includes a plurality of protrusions parallel to the top surface of the semiconductor die.

12. The semiconductor die package of claim 8, wherein the plurality of protrusions are parallel to the top surface of the semiconductor die.

13. The semiconductor die package of claim 8, further comprising:
    a second die pad;
    a second semiconductor die attached to a top surface of the second die pad; and
    a second clip mount attached to a top surface of the second semiconductor die.

14. The semiconductor die package of claim 13, wherein the second clip mount comprises a plurality of protrusions located in at least one side of the second clip mount.

15. The semiconductor die package of claim 14, wherein the plurality of protrusions extend in a direction parallel to the top surface of the second semiconductor die.

16. The semiconductor die package of claim 8, wherein the clip mount includes a flange in a top surface of the clip mount.

17. A system comprising:
    processing circuitry configured to output processed data and signals; and
    a power converter coupled to a power source and configured to convert power from the power source to a power level or a polarity usable by the processing circuitry;
    wherein the power converter includes at least one semiconductor die package, the semiconductor die package comprising:
    a leadframe;
    a semiconductor die attached to a top surface of the leadframe;
    a contact region; and
    a clip mount having a bridge portion and a columnar portion forming an angle at a junction between the bridge portion and the columnar portion;
    wherein the columnar portion is coupled to the contact region and the bridge portion is coupled to a top surface of the semiconductor die;
    wherein the bridge portion comprises a plurality of sides, at least one of the plurality of side having a locking feature formed from a plurality of protrusions, the locking feature comprising an alternating pattern of teeth and valleys.

18. The system of claim 17, wherein the plurality of protrusions extend in a direction parallel to the top surface of the semiconductor die.

19. The system of claim 17, wherein the clip mount is comprised of one of copper and a copper alloy.

20. The system of claim 19, wherein the clip mount is plated with a second metallic material.

21. The system of claim 17, wherein each of two sides of the cantilevered portion includes a plurality of protrusions that extend in a direction parallel to the top surface of the semiconductor die.

22. The system of claim 17, further comprising:

a second leadframe;

a second semiconductor die attached to a top surface of the second leadframe; and a second clip mount having a cantilevered portion and a columnar portion forming an angle at a junction between the cantilevered portion and the columnar portion, the cantilevered portion of the second clip mount attached to a top surface of the second semiconductor die.

23. The system of claim 22, wherein the cantilevered portion of the second clip mount comprises a plurality of protrusions located in at least one side of the cantilevered portion.

24. The system of claim 23, wherein the plurality of protrusions extend in a direction parallel to the top surface of the second semiconductor die.

25. The system of claim 17, wherein the clip mount includes a flange in a top surface of the cantilevered portion.

26. A method of manufacturing a clip mount, the method comprising:

forming a locking feature comprising an alternating pattern of of teeth and valleys into at least a portion of one or more sides of a sheet of electrically conductive material; and configuring the sheet of electrically conductive material to form a columnar part and a bridge part that form an angle at an interface between the columnar part and the bridge part, the locking feature formed into at least one side of the bridge part.

27. The method of claim 26, wherein forming the plurality of teeth comprises etching the plurality of teeth into at least a portion of two sides of the sheet of electrically conductive material.

28. The method of claim 26, wherein the sheet of electrically conductive material comprises one of a copper or copper alloy.

29. The method of claim 26, wherein the method further comprises plating the sheet of electrically conductive material with a metallic material.

30. The method of claim 26, further comprising treating the sheet of electrically conductive material with chemicals to increase roughness of the cantilevered portion.

31. The method of claim 26, further comprising configuring the sheet of electrically conductive material to form a flange in the cantilevered portion.

\* \* \* \* \*